(12) United States Patent
Hatakeyama et al.

(10) Patent No.: US 11,735,246 B2
(45) Date of Patent: Aug. 22, 2023

(54) SEMICONDUCTOR DEVICE PERFORMING REFRESH OPERATION

(71) Applicant: MICRON TECHNOLOGY, INC., Boise, ID (US)

(72) Inventors: Atsushi Hatakeyama, Kokubunji (JP); Hyun Yoo Lee, Boise, ID (US); Kang-Yong Kim, Boise, ID (US); Akiyoshi Yamamoto, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/454,963

(22) Filed: Nov. 15, 2021

(65) Prior Publication Data

US 2023/0154520 A1 May 18, 2023

(51) Int. Cl.
*G11C 7/00* (2006.01)
*G11C 11/406* (2006.01)

(52) U.S. Cl.
CPC .. *G11C 11/40618* (2013.01); *G11C 11/40615* (2013.01)

(58) Field of Classification Search
CPC ................................................ G11C 11/40618
USPC ......................................................... 365/222
See application file for complete search history.

(56) References Cited

U.S. PATENT DOCUMENTS

| 2006/0265556 | A1 | 11/2006 | Janzen et al. |
| 2010/0182864 | A1* | 7/2010 | Ichimura ........... G11C 11/40622 365/236 |
| 2018/0025769 | A1* | 1/2018 | Lee .................... G11C 11/4093 365/189.05 |
| 2020/0027500 | A1 | 1/2020 | Heymann et al. |
| 2020/0066328 | A1 | 2/2020 | Fu et al. |
| 2020/0194056 | A1 | 6/2020 | Sakurai et al. |
| 2021/0064296 | A1 | 3/2021 | Ito et al. |

OTHER PUBLICATIONS

International Search Report & Written Opinion dated Mar. 15, 2023 for PCT Application No. PCT/US2022/049982.

* cited by examiner

*Primary Examiner* — Hoai V Ho
(74) *Attorney, Agent, or Firm* — Dorsey & Whitney LLP

(57) ABSTRACT

Disclosed herein is an apparatus that includes a plurality of memory banks and a refresh controller configured to perform a refresh operation on one or more of the plurality of memory banks having a first state without performing the refresh operation on one or more of the plurality of memory banks having a second state responsive to a first refresh command, and perform the refresh operation on a selected one of the plurality of memory banks responsive to a second refresh command. The refresh controller is configured to bring the selected one of the plurality of memory banks into the second state when the refresh operation is performed responsive to the second refresh command.

19 Claims, 7 Drawing Sheets

| # | COMMAND | BG1 | BG0 | BA1 | BA0 | REFPB | REFRESH BANK | REFRESH BANK COUNTER | REFRESH COUNTER |
|---|---|---|---|---|---|---|---|---|---|
| 1 | REFPB | X | 0 | 0 | 0 | 0 | 0/8 | 0 to 1 | n |
| 2 | REFPB | X | 0 | 0 | 1 | 1 | 1/9 | 1 to 2 | n |
| 3 | REFPB | X | 0 | 1 | 0 | 2 | 2/10 | 2 to 3 | n |
| 4 | REFPB | X | 0 | 1 | 1 | 3 | 3/11 | 3 to 4 | n |
| 5 | REFPB | X | 1 | 0 | 0 | 4 | 4/12 | 4 to 5 | n |
| 6 | REFPB | X | 1 | 0 | 1 | 5 | 5/13 | 5 to 6 | n |
| 7 | REFPB | X | 1 | 1 | 0 | 6 | 6/14 | 6 to 7 | n |
| 8 | REFPB | X | 1 | 1 | 1 | 7 | 7/15 | 7 to 0 | n |
| 9 | REFPB | X | 0 | 0 | 0 | 0 | 0/8 | 0 to 1 | n+1 |
| 10 | REFPB | X | 0 | 0 | 1 | 1 | 1/9 | 1 to 2 | n+1 |
| ⋮ | | | | | | | | | n+1 |
| 15 | REFPB | X | 1 | 1 | 0 | 6 | 6/14 | 6 to 7 | n+1 |
| 16 | REFPB | X | 1 | 1 | 1 | 7 | 7/15 | 7 to 0 | n+1 |
| 17 | REFAB | X | X | X | X | — | 0~15 | 0 | n+2 |
| 18 | REFPB | X | 0 | 0 | 0 | 0 | 0/8 | 0 to 1 | n+3 |
| 19 | REFPB | X | 0 | 0 | 1 | 1 | 1/9 | 1 to 2 | n+3 |
| 20 | REFPB | X | 0 | 1 | 0 | 2 | 2/10 | 2 to 3 | n+3 |
| 21 | REFAB | X | X | X | X | — | 3~7,11~15 | 0 | n+3 |
| 22 | REFPB | X | 0 | 0 | 0 | 0 | 0/8 | 0 to 1 | n+4 |
| 23 | REFPB | X | 0 | 0 | 1 | 1 | 1/9 | 1 to 2 | n+4 |
| ⋮ | | | | | | | | | n+4 |
| 28 | REFPB | X | 1 | 1 | 0 | 6 | 6/14 | 6 to 7 | n+4 |
| 29 | REFPB | X | 1 | 1 | 1 | 7 | 7/15 | 7 to 0 | n+4 |

FIG.3

SEMICONDUCTOR DEVICE PERFORMING REFRESH OPERATION

BACKGROUND

A DRAM is a volatile semiconductor memory device in which data in a memory cell is retained by periodically performing a refresh operation. Reduction of current consumption caused by the refresh operation is desired in order to reduce current consumption in the DRAM.

BRIEF DESCRIPTION OF THE DRAWINGS

FIG. 3 is a table for explaining a relationship among commands and addresses and memory banks subjected to a refresh operation;

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
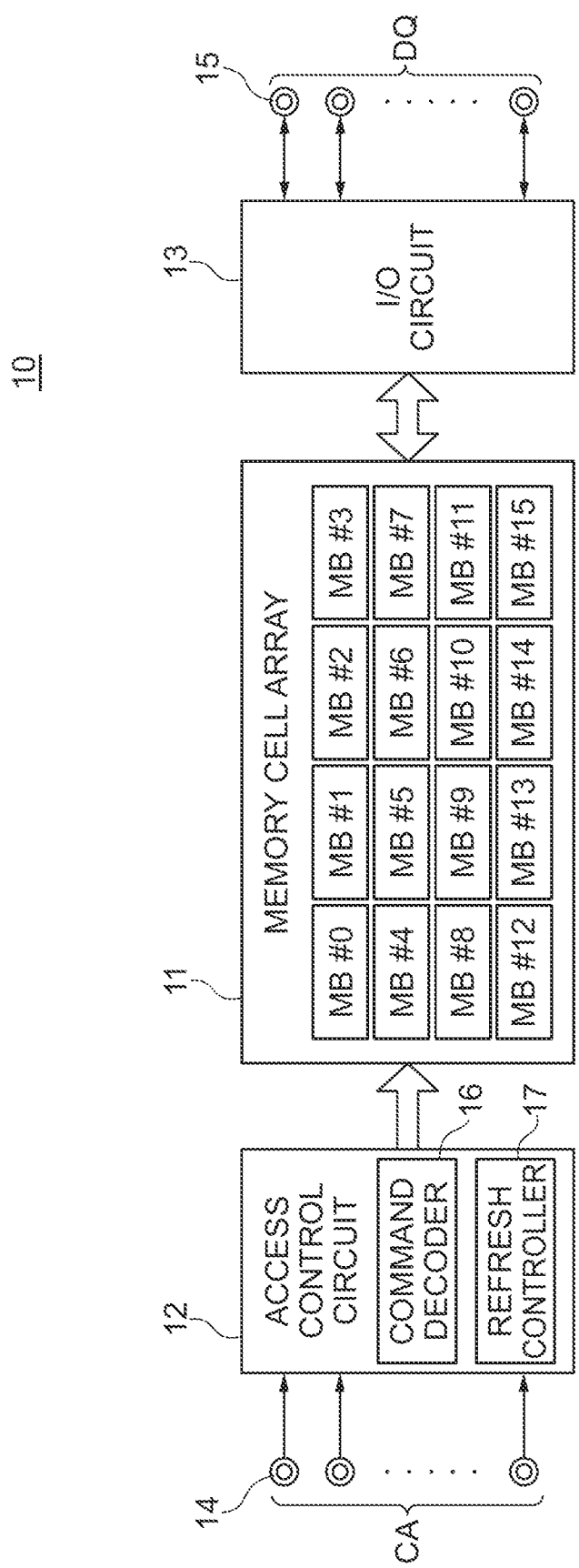
FIG. 1 is a block diagram showing a configuration of a semiconductor device according to an embodiment of the present disclosure.

FIG. 1 is a block diagram showing a configuration of a semiconductor device 10 according to the present disclosure. The semiconductor device 10 shown in FIG. 1 is, for example, a DRAM and includes a memory cell array 11, an access control circuit 12 that makes access to the memory cell array 11, and an I/O circuit 13 that performs input and output of data to/from the memory cell array 11. The memory cell array 11 includes 16 memory banks MB #0 to MB #15. The access control circuit 12 makes access to the memory cell array 11 based on a command address signal CA input from an external controller via a command address terminal 14. In a read operation, data DQ read out from any of the memory banks MB #0 to MB #15 is output to a data I/O terminal 15 via the I/O circuit 13. In a write operation, data DQ input from the external controller to the data I/O terminal 15 is written to any of the memory banks MB #0 to MB #15 via the I/O circuit 13. The access control circuit 12 includes a command decoder 16 and a refresh controller 17.

Figure 2:
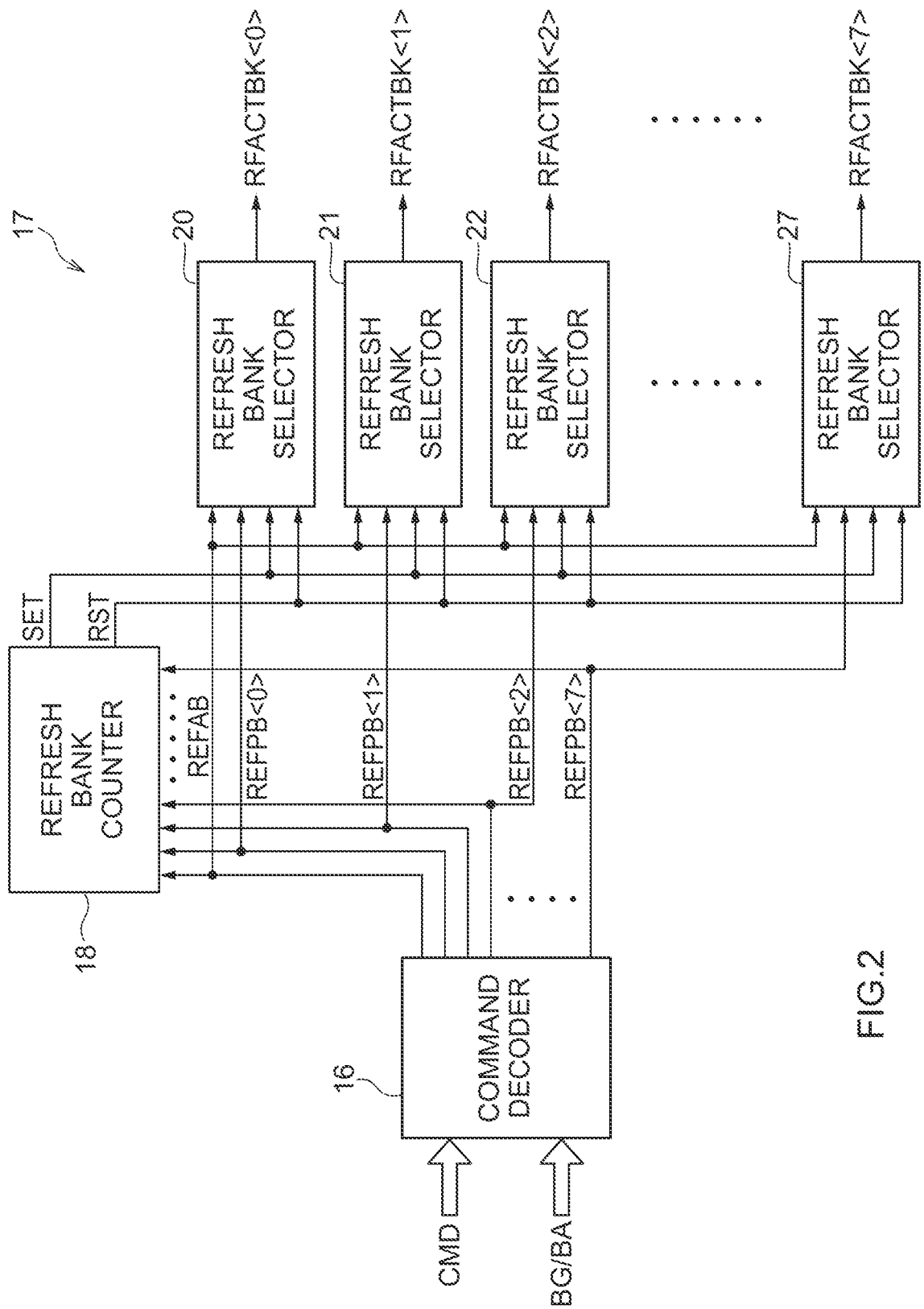
FIG. 2 is a block diagram showing a configuration of a refresh controller.

FIG. 2 is a block diagram showing a configuration of the refresh controller 17. As shown in FIG. 2, the refresh controller 17 includes a refresh bank counter 18 and eight refresh bank selectors 20 to 27. Refresh signals REFAB and REFPB<0> to REFPB<7> output from the command decoder 16 are supplied to the refresh bank counter 18, When a command CMD included in the command address signal CA indicates an all-bank-refresh command, the command decoder 16 activates the all-bank-refresh signal REFAB. When the command CMD included in the command address signal CA indicates a per-bank-refresh command, the command decoder 16 activates any of the per-bank-refresh signals REFPB<0> to REFPB<7> based on a bank group address BG and a bank address BA. As shown in FIG. 3, the bank group address BG has a 2-bit configuration including BG0 and BG1, and the bank address BA has a 2-bit configuration including BA0 and BA1. In a normal read/write operation, any one of the 16 memory banks MB #0 to MB #15 is selected based on the bank group address BG and the bank address BA. In a per-bank-refresh operation, the bank group address BG1 is disabled, and two memory banks to be refreshed are selected based on three bits including the bank group address BG0 and the bank addresses BA0 and BA1. For example, when values of the addresses BG0, BA1, and BA0 are <000> as shown in an access number #1, the per-bank-refresh signal REFPB<0> is activated and, in response to this activation, a refresh operation is performed on the memory banks MB #0 and MB #8. When the values of the addresses BG0, BA1, and BA0 are <001> as shown in an access number #2, the per-bank-refresh signal REFPB<1> is activated and, in response to this activation, a refresh operation is performed on the memory banks MB #1 and MB #9. Meanwhile, in an all-bank-refresh operation as shown in an access number #17, all the bank group address BG and the bank address BA are disabled and the all-bank-refresh signal REFAB is activated. When the all-bank-refresh signal REFAB is activated, a refresh operation is performed on all the memory banks MB #0 to MB #18 in principle. in some cases, as details thereof are described later, a refresh operation on one or more memory banks is skipped also in the all-bank-refresh operation as shown in an access number #21. In the example shown in FIG. 3, a refresh operation on the memory banks MB #0 to MB #2 and MB #8 to MB #10 is skipped in an all-bank-refresh operation that is performed immediately after a refresh operation on the memory banks MB #0 to MB #2 and MB #8 to MB #10 as shown in access numbers #18 to #20.

Figure 4:
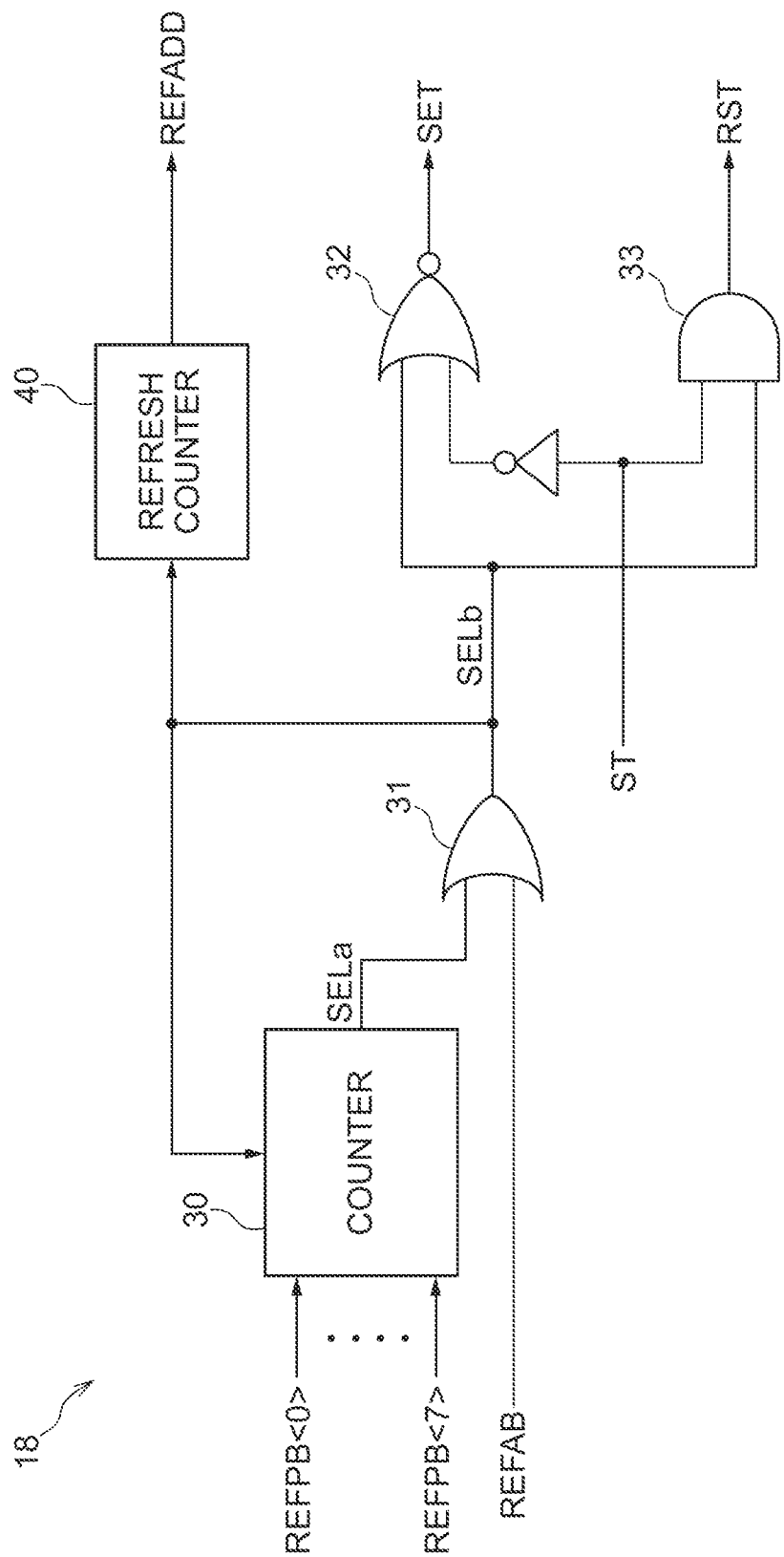
FIG. 4 is a circuit diagram showing a configuration of a refresh bank counter.

FIG. 4 is a circuit diagram showing a configuration of the refresh bank counter 18. As shown in FIG. 4. the refresh bank counter 18 includes a counter 30 that counts the per-bank-refresh signals REFPB<0> to REFPB<7> and an OR gate circuit 31 that receives a selection signal SELa output from the counter 30 and the all-bank-refresh signal REFAB and generates a selection signal SELb. The counter 30 counts the per-bank-refresh signals REFPB<0> to REFPB<7> and, when detecting all the per-bank-refresh signals REFPB<0> to REFPB<7>, activates the selection signal SELa to a high level. Therefore, when all the per-bank-refresh signals REFPB<0> to REFPB<7> are activated or when the all-bank-refresh signal REFAB is activated, the selection signal SELb is activated to a high level. The selection signal SELb is fed back to the counter 30 to reset a value of the counter 30. The selection signal SELb is also supplied to a refresh counter 40. The refresh counter 40 updates a refresh address REFADD in response to the selection signal SELb. The selection signal SELb is supplied to one input node of a NOR gate circuit 32 and one input node of an AND gate circuit 33. A inverted signal of a state signal ST is supplied to the other input node of the NOR gate circuit 32. The state signal ST is supplied to the other input node of the AND gate circuit 33. The state signal ST is activated to a high level in a refresh operation.

Figure 5A:
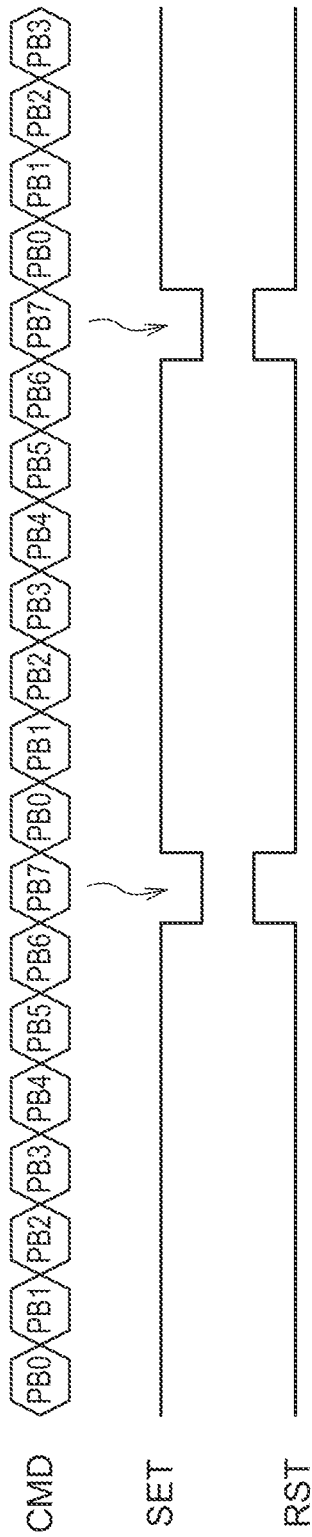
FIGS. 5A and 5B are timing charts for explaining an operation of the refresh bank counter.
Figure 5B:
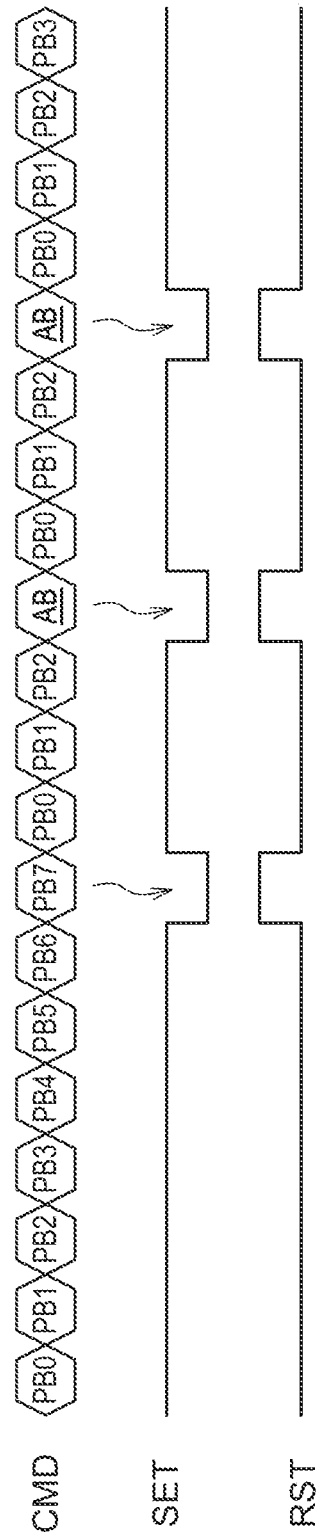

Therefore, when the per-bank-refresh signals REFPB<0> to REFPB<7> are sequentially activated as shown in the access numbers #1 to #8 in FIG. 3, the selection signals SELa and SELb are activated in response to the eighth per-bank-refresh signal REFPB<7>. Consequently, as shown in FIG. 5A, while the first to seventh per-bank-refresh signals REFPB<0> to REFPB<6> are input, a set signal SET output from the NOR gate circuit 32 is high and a reset signal RST output from the AND gate circuit 33 is low. Thereafter, when the per-bank-refresh signals REFPB<0> to REFPB<7> are sequentially activated again as shown in access numbers #9 to #16 in FIG. 3, the selection signals SELa and SELb are activated in response to the eighth per-bank-refresh signal REFPB<7>, as shown in FIG. 5A. In this manner, every time the eighth per-bank-refresh signal REFPB<7> is activated, the set signal SET becomes low and the reset signal RST becomes high. Although the per-bank-refresh signals REFPB<0> to REFPB<7> are activated in this order in the example shown in FIGS. 3 and 5A, the order of activation of the per-bank-refresh signals REFPB<0> to REFPB<7> is determined by the bank group address BG and the bank address BA input from an external controller. Meanwhile, as shown in FIG. 5B, when the all-bank-refresh signal REFAB is activated, the set signal SET immediately becomes low and the reset signal RST immediately becomes high. As described above, when the first to seventh per-bank-refresh signals are activated, the set signal SET is activated. When the all-bank-refresh signal REFAB is activated or when the eighth per-bank-refresh signal is activated, the reset signal RST is activated.

The set signal SET and the reset signal RST are supplied to the refresh bank selectors 20 to 27 in common as shown in FIG. 2. In addition, the all-bank-refresh signal REFAB is supplied to the refresh bank selectors 20 to 27 in common, and the per-bank-refresh signals REFPB<0> to REFPB<7> corresponding to the refresh bank selectors 20 to 27 are supplied to the refresh bank selectors 20 to 27, respectively.

Figure 6:
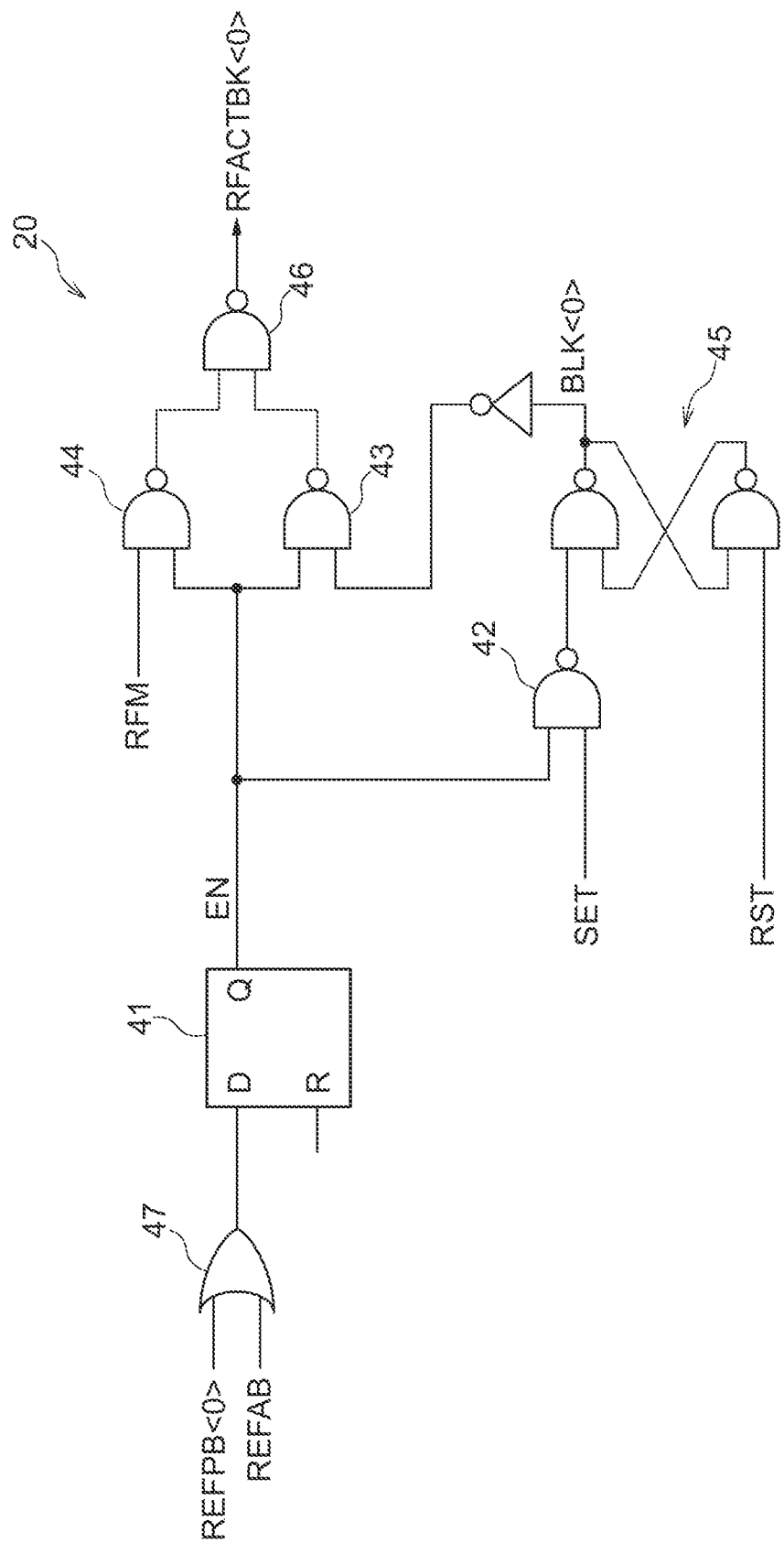
FIG. 6 is a circuit diagram showing a configuration of a refresh bank selector.

FIG. 6 is a circuit diagram showing a configuration of the refresh bank selector 20. As shown in FIG. 6, the refresh bank selector 20 includes an OR gate circuit 47 that receives the per-bank-refresh signal REFPB<0> and the all-bank-refresh signal REFAB and a latch circuit 41 that latches an output signal of the OR gate circuit 47. An enable signal EN output from the latch circuit 41 is supplied to one input nodes of NAND gate circuits 42 to 44. In an initial state, an SR latch circuit 45 is reset, and a block signal BLK output from the SR latch circuit 45 is low. Therefore, when the enable signal EN is activated to a high level, an output signal of the NAND gate circuit 43 becomes low, and a refresh bank signal RFACTBK<0> output from a NAND gate circuit 46 is activated to a high level. Accordingly, the memory banks MB #0 and MB #8 perform a refresh operation on a refresh address REFADD indicated by the refresh counter 40 shown in FIG. 4.

The set signal SET is supplied to the other input node of the NAND gate circuit 42. Therefore, when the per-bank-refresh signal REFPB<0> or the all-bank-refresh signal REFAB is activated while the set signal SET is high, an output signal of the NAND gate circuit 42 becomes low, and the SR latch circuit 45 is set. Accordingly, the block signal BLK output from the SR latch circuit 45 becomes high, and a subsequent enable signal EN is disabled. However, when a special refresh command indicating refresh management is issued from an external controller, a refresh management signal RFM is activated, and an output signal of the NAND gate circuit 44 becomes low in response to the enable signal EN. Therefore, even if the block signal BLK is at a high level, the refresh bank signal RFACTBK<0> output from the NAND gate circuit 46 is activated to a high level, so that a refresh operation on the memory banks MB #0 and MB #8 is performed. In the refresh operation using the refresh management signal RFM, the refresh address REFADD output from the refresh counter 40 is not used. Instead, a special refresh address prepared for refresh management is used.

When the reset signal RST is activated, the SR latch circuit 45 is reset, and the block signal BLK is cleared. The other refresh bank selectors 21 to 27 also have the same circuit configuration as that in FIG. 6 except that the per-bank-refresh signals REFPB<1> to REFPB<7> are used, respectively, in place of the per-bank-refresh signal REFPB<0>.

Figure 7:
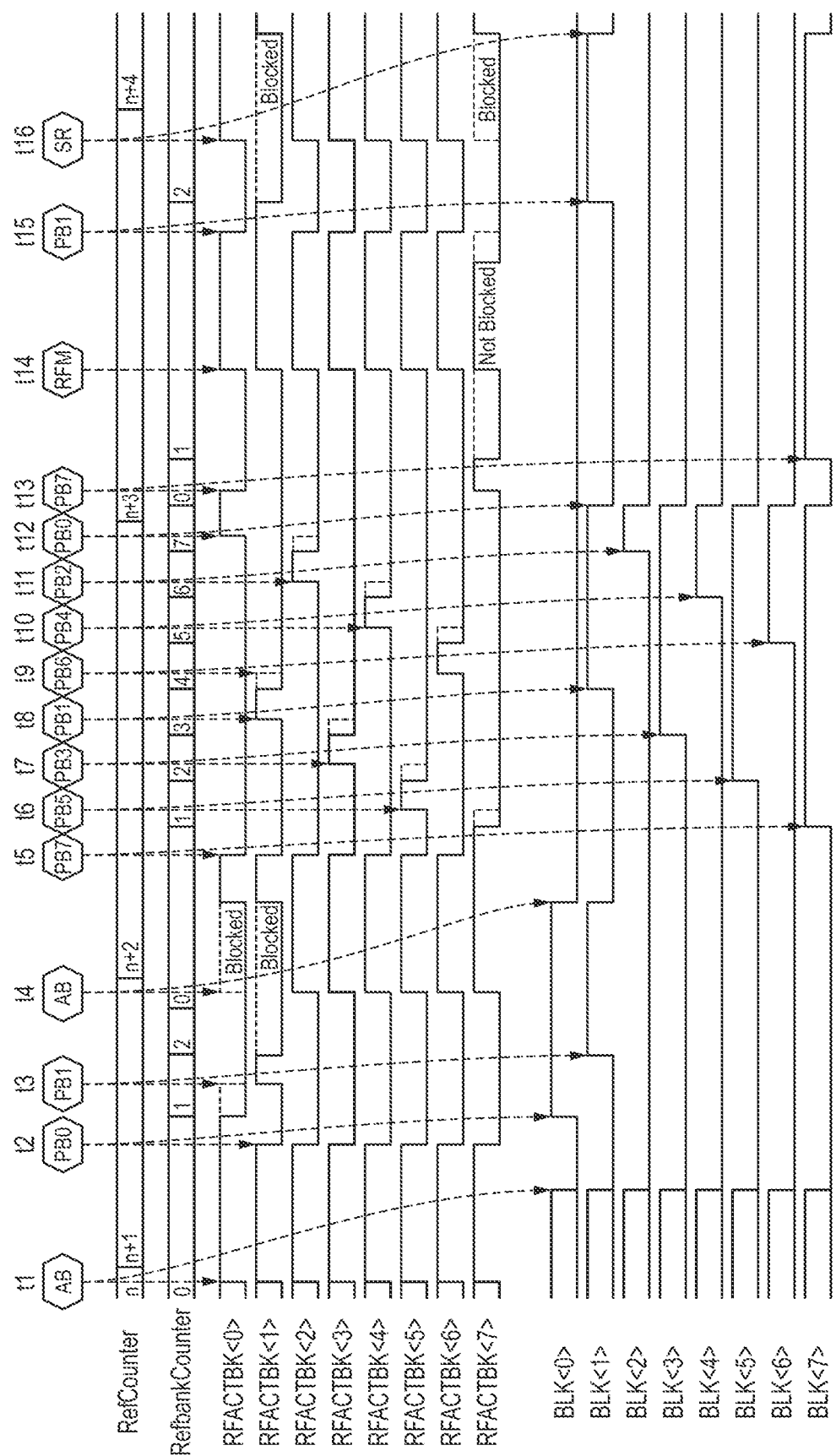
FIG. 7 is a timing chart for explaining an operation of the semiconductor device according to an embodiment of the present disclosure.

FIG. 7 is a timing chart for explaining an operation of the semiconductor device 10 according to the present disclosure. In the example shown in FIG. 7, the all-bank-refresh signal REFAB is activated at a time t1. In response to this activation, the refresh bank signals RFACTBK<0> to RFACTBK<7> are activated to a high level, and a refresh operation is performed on a refresh address n in the memory banks MB #0 to MB #15. Further, in response to activation of the all-bank-refresh signal REFAB, a value of the refresh address REFADD is updated from n to n +1. Although block signals BLK<0> to BLK<7> in the refresh bank selectors 20 to 27 become high for a short time in response to activation of the all-bank-refresh signal REFAB, they are immediately changed to a low level by activation of the reset signal RST.

Next, when the per-bank-refresh signal REFPB<0> is activated at a time t2, the refresh bank signal RFACTBK<0> is activated to a high level in response to this activation, so that a refresh operation is performed on the refresh address n+1 in the memory banks MB #0 and MB #8. Further, the block signal BLK<0> in the refresh bank selector 20 becomes high. Next, when the per-bank-refresh signal REFPB<1> is activated at a time t3, the refresh bank signal RFACTBK<1> is activated to a high level in response to this activation, so that a refresh operation is performed on the refresh address n+1 in the memory banks MB #1 and MB #9. In addition, the block signal BLK<1> in the refresh bank selector 21 becomes high.

Next, when the all-bank-refresh signal REFAB is activated at a time t4, the refresh bank signals RFACTBK<2> to RFACTBK<7> are activated to a high level in response to this activation, so that a refresh operation is performed on the refresh address n+1 in the memory banks MB #2 to MB #7 and MB #10 to MB #15. Meanwhile, the per-bank-refresh signals REFPB<0> and REFPB<1> are blocked because the block signals BLK<0> and BLK<1> have become high in the refresh bank selectors 20 and 21 for which a per-bank-refresh operation has been performed at the times t2 and t3. Accordingly a duplicate refresh operation on the refresh address n+1 in the memory banks MB #0, MB #1, MB #8, and MB #9 is avoided, resulting in reduction of current consumption. Thereafter, the value of the refresh address REFADD is updated from n+1 to n+2 and the block signals BLK<0> to BLK<7> in all the refresh bank selectors 20 to 27 are cleared by activation of the reset signal RST.

At times t5 to t12, the per-bank-refresh signals REFPB<7>, REFPB<5>, REFPB<3>, REFPB<1>, REFPB<6>, REFPB<4>, REFPB<2>, and REFPB<0> are activated in this order. In response to such activation, the refresh bank signals RFACTBK<7>, RFACTBK<5>, RFACTBK<3>, RFACTBK<1>, RFACTBK<6>, RFACTBK<4>, RFACTBK<2>, and RFACTBK<0> are activated to a high level in this order, so that a refresh operation is performed on the refresh address n+2 in the memory banks MB #0 to MB #15. When a per-bank-refresh operation has been performed on the refresh address n+2 in all the memory banks MB #0 to MB #15 in this manner, the value of the refresh address REFADD is updated from n+2 to n+3, and the block signals BLK<0> to BLK<7> in all the refresh bank selectors 20 to 27 are cleared by activation of the reset signal RST.

Subsequently, when the per-bank-refresh signal REFPB<7> is activated at a time t13, the refresh bank signal RFACTBK<7> is activated to a high level in response to this activation, so that a refresh operation is performed on the refresh address n+3 in the memory banks MB #7 and MB #15. Further, the block signal BLK<7> in the refresh bank selector 27 becomes high. Next, when the refresh management signal RFM is activated at a time t14, the refresh bank signals RFACTBK<0> to RFACTBK<7> are activated to a high level in response to this activation, so that a refresh operation is performed on any refresh address REFADD in the memory banks MB #0 to MB #15. At this time, although the block signal BLK<7> in the refresh bank selector 27 is at a high level, the refresh bank signal RFACTBK<7> is activated without being blocked. It is therefore possible to perform a refresh operation on a special refresh address prepared for refresh management. Further, even after completion of the refresh operation in response to the refresh management signal RFM, the refresh counter 40 is not updated, and its value is maintained to be n+3. Therefore, when the per-bank-refresh signal REFPB<1> is activated at a time t15, the refresh bank signal RFACTBK<1> is activated to a high level in response to this activation, so that a refresh operation is performed on the refresh address n+3 in the memory banks MB #1 and MB #9. In addition, the block signal BLK<1> in the refresh bank selector 21 becomes high.

Next, when a self refresh signal SR is activated at a time t16, the refresh bank signals RFACTBK<0> and RFACTBK<2> to RFACTBK<6> are activated to a high level in response to this activation, so that a self refresh operation is performed on the refresh address n+3 in the memory banks MB #0, MB #2 to MB #6, MB #8, and MB #10 to MB #14. Meanwhile, the per-bank-refresh signals REFPB<1> and REFPB<7> are blocked because the block signals BLK<1> and BLK<7> have become high in the refresh bank selectors 21 and 27 for which a per-bank-refresh operation has been performed at the times t13 and t15. Accordingly a duplicate refresh operation on the refresh address n+3 in the memory banks MB #1, MB #7, MB #9, and MB #15 is avoided, resulting in reduction of current consumption. Thereafter, the value of the refresh address REFADD is updated from n+3 to n+4, and the block signals BLK<0> to BLK<7> in all the refresh bank selectors 20 to 27 are cleared by activation of the reset signal RST. Thereafter, a normal self refresh operation is performed.

As described above, in each of an all-bank-refresh operation and a self refresh operation, the semiconductor device 10 according to the present disclosure does not perform a duplicate refresh operation on a memory bank on which a per-bank-refresh operation has been completed for the same refresh address immediately before that refresh operation. Accordingly current consumption required for a refresh operation is reduced.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fail within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a plurality of memory banks; and
a refresh controller configured to perform a refresh operation on one or more of the plurality of memory banks having a first state without performing the refresh operation on one or more of the plurality of memory banks having a second state responsive to a first refresh command, and perform the refresh operation on a selected one of the plurality of memory banks responsive to a second refresh command,
wherein the refresh controller is configured to bring the selected one of the plurality of memory banks into the second state when the refresh operation is performed responsive to the second refresh command.

2. The apparatus of claim 1, wherein the refresh controller is configured to bring all the plurality of memory banks into the first state when the refresh operation is performed responsive to the first refresh command.

3. The apparatus of claim 1, wherein the refresh controller is configured to bring all the plurality of memory banks into the first state when the refresh operations to all the plurality of memory banks responsive to a plurality of the second refresh commands are performed.

4. The apparatus of claim 1, wherein the first refresh command is an all-bank refresh command.

5. The apparatus of claim 4, wherein the second refresh command is a per-bank refresh command.

6. The apparatus of claim 1, wherein the first refresh command is a self refresh command.

7. The apparatus of claim 1,
wherein the refresh controller includes a refresh counter configured to generate a refresh address supplied in common to the plurality of memory banks, and
wherein the refresh counter is configured to be updated each time all the plurality of memory banks are in the second state.

8. The apparatus of claim 7, wherein the refresh controller is configured to perform the refresh operation to the plurality of memory banks regardless of a state thereof responsive to a third refresh command.

9. The apparatus of claim 8, wherein the refresh controller is configured to perform, responsive to the third refresh command, the refresh operation to the plurality of memory banks by using another refresh address different from the refresh address generated by the refresh counter.

10. An apparatus comprising:
a plurality of memory banks; and a refresh controller configured to:
  perform, responsive to a per-bank-refresh command, a first refresh operation on a selected one of the plurality of memory banks;
  set, responsive to the per-bank-refresh command, a state of the selected one of the plurality of memory banks to be a set state which prohibits a refresh operation from being performed;
  perform, responsive to an all-bank-refresh command issued after the per-bank-refresh command, a second refresh operation on each of the plurality of memory banks except for the selected one of the plurality of memory banks having the set state that was set responsive to the per-bank-refresh command; and
  set, responsive to the all-bank-refresh command, the state of the selected one of the plurality of memory banks to be a reset state which allows a refresh operation to be performed.

11. The apparatus of claim 10,
wherein the refresh controller includes a refresh counter, and
wherein the refresh controller is further configured to:
  maintain a stored address value of the refresh counter regardless of receiving the per-bank-refresh command; and
  update the stored address value of the refresh counter responsive to receiving the all-bank-refresh command.

12. The apparatus of claim 11, wherein the refresh controller is further configured to update the stored address value of the refresh counter when the first refresh operations using the stored address are performed in all the plurality of memory banks responsive to receiving a plurality of the per-bank-refresh commands.

13. The apparatus of claim 11, wherein the refresh controller is further configured to:
  perform the refresh operation on the plurality of memory banks responsive to a refresh management command; and
  perform, responsive to the refresh management command, the refresh operation on the plurality of memory banks by using a refresh address different from the stored address value of the refresh counter.

14. The apparatus of claim 13, wherein the refresh controller is further configured to maintain the stored address value regardless of receiving the refresh management command.

15. The apparatus of claim 14, wherein the refresh controller is further configured to generate the refresh address independently of the refresh counter.

16. An apparatus comprising:
a plurality of memory banks; and
a refresh controller including a plurality of SR-latch circuits, each of the plurality of SR-latch circuits corresponding to a respective one of the plurality of memory banks,
wherein each of the plurality of SR-latch circuits is configured to be set to one of a first state and a second state, and
wherein the refresh controller is configured, responsive to a first refresh command, to:
  perform a refresh operation on a first group of the plurality of memory banks of which corresponding SR-latch circuits are set to the first state; and
  skip a refresh operation to a second group of the plurality of memory banks of which corresponding SR-latch circuits are set to the second state,
wherein the refresh controller is further configured to perform the refresh operation on a selected one of the plurality of memory banks responsive to a second refresh command, and
wherein one of the plurality of SR-latch circuits corresponding to the selected one of the plurality of memory banks is set to the second state.

17. The apparatus of claim 16, wherein all of the plurality of SR-latch circuits are set to the first state responsive to the first refresh command.

18. The apparatus of claim 17, wherein the first refresh command is an all-bank refresh command.

19. The apparatus of claim 18, wherein the second refresh command is a per-bank refresh command.

* * * * *